United States Patent
Kyoung et al.

(10) Patent No.: US 6,933,809 B2
(45) Date of Patent: Aug. 23, 2005

(54) FILM BULK ACOUSTIC RESONATOR (FBAR) DEVICE AND METHOD FOR PRODUCING THE SAME

(75) Inventors: Je Hong Kyoung, Kyungki-do (KR); Kook Hyun Sunwoo, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 80 days.

(21) Appl. No.: 10/601,658

(22) Filed: Jun. 24, 2003

(65) Prior Publication Data

US 2005/0035828 A1 Feb. 17, 2005

(30) Foreign Application Priority Data

Apr. 7, 2003 (KR) .................. 10-2003-0021705

(51) Int. Cl.[7] .................................................. H03H 9/00
(52) U.S. Cl. ...................................... 333/193; 333/187
(58) Field of Search ............................. 333/187, 189, 333/193, 219

(56) References Cited

U.S. PATENT DOCUMENTS

2004/0021191 A1 * 2/2004 Bradley ...................... 257/458
2004/0021400 A1 * 2/2004 Bradley et al. ............. 310/324
2004/0142497 A1 * 7/2004 Bradley ......................... 438/3
2004/0172798 A1 * 9/2004 Ruby et al. ................ 29/25.35
2004/0227590 A1 * 11/2004 Larson, III et al. ......... 333/189

OTHER PUBLICATIONS

Patent Abstracts of Japan, Publication No. 2000–196157 dated Jul. 14, 2000.

* cited by examiner

*Primary Examiner*—Don Le
(74) *Attorney, Agent, or Firm*—Lowe Hauptman & Berner, LLP

(57) ABSTRACT

An FBAR device includes a substrate structure provided with an upper surface, a seed layer formed on the upper surface of the substrate structure and made of one selected from gold (Au) and titanium (Ti), and one or more acoustic resonant portions. Each of the acoustic resonant portions includes a lower electrode film formed on the seed layer and made of molybdenum (Mo), a piezoelectric layer formed on the lower electrode film and made of aluminum nitride (AlN), and an upper electrode film formed on the piezoelectric layer.

20 Claims, 8 Drawing Sheets (a)

(b)

(c)

FILM BULK ACOUSTIC RESONATOR (FBAR) DEVICE AND METHOD FOR PRODUCING THE SAME

BACKGROUND OF THE INVENTION

1. Field of the Invention

The present invention relates to a FBAR (Film Bulk Acoustic Resonator), and more particularly to a FBAR device comprising a lower electrode film with crystalline characteristics required to form an excellent piezoelectric film and improved electrode film characteristics, and a method for producing the same.

2. Description of the Related Art

In order to meet the rapid development of communication techniques, there has been required the development of signal processing and RF (Radio Frequency) component manufacturing techniques. Particularly, the RF component manufacturing techniques have been developed such that filter components are replaced with FBAR filters so as to meet miniaturization trends of mobile communication units and radio sets.

A FBAR device has a fundamental structure in which an electrode is formed on upper and lower surfaces of a piezoelectric layer on an air gap. When voltage is applied to the upper and lower electrodes, a part of electric energy is converted to mechanical energy such as an acoustic wave by resonance characteristics of the piezoelectric layer. Thereby, the FBAR device is operated as a filter.

Generally, a FBAR device is formed on a substrate. The substrate includes various isolation structures for protecting the substrate from acoustic waves generated from a piezoelectric layer of the FBAR device. For example, the substrate of the FBAR device may have a certain space formed at an area corresponding to a resonance generating position shown in FIG. 1, i.e., an air gap, or have a reflective layer using Bragg reflection.

FIG. 1 is a cross-sectional view of a conventional FBAR (Film Bulk Acoustic Resonator) device using an air gap.

As shown in FIG. 1, the FBAR device comprises a substrate structure 10, and an acoustic resonant portion 20 including a lower electrode film 22, a piezoelectric layer 24 and an upper electrode film 26 formed on the substrate structure 10 in sequence. As shown in FIG. 1, the substrate structure 10 includes a silicon substrate 11 and an air gap 15 formed on the upper surface of the silicon substrate 11. The air gap 15 of the substrate structure 100 is obtained by forming a cavity in the upper surface of the substrate 11, filling the cavity with a sacrificial layer, filling the acoustic resonant portion 20 with the sacrificial layer, and removing the sacrificial layer through via holes.

Generally, the piezoelectric layer 24 is made of aluminum nitride, i.e., AlN, and the lower and upper electrode films 22 and 26 are made of molybdenum (Mo). Characteristics of the FBAR device are determined by the piezoelectric layer 24 and the lower and upper electrode films 22 and 26, and particularly resonance characteristics of the piezoelectric layer 24 is a leading factor for determining a Q value of the FBAR device.

In order to obtain excellent resonance characteristics of the FBAR device, the AlN layer of the piezoelectric layer 24 is grown so that it has a preference for (002) orientation. The crystalline characteristics of the piezoelectric layer 24 are much dependent on the crystalline characteristics of a lower electrode. That is, the resonance characteristics of the FBAR device depend on the crystalline structure of the Mo lower electrode film 26. Accordingly, in order to obtain a preference for (002) orientation of the AlN layer, the lower electrode film 22 requires a preference for (110) orientation during its growth.

Conventionally, in order to obtain the above crystalline characteristics of the Mo lower electrode film, a method for improving the conditions in a depositing step of the lower electrode film has been used. For example, the crystalline characteristics of the Mo lower electrode film are changed by raising the sputtering power or the temperature of the substrate in the depositing step or lowering the partial pressure of argon (Ar) in a Mo sputtering step for forming the lower electrode film. However, it is difficult to obtain sufficient crystalline characteristics of the Mo lower electrode film only by changing the conditions of the sputtering step, and the control of the change of the conditions complicates the process.

Further, the change of the conditions undesirably influences the Mo electric film, in the process for improving the crystalline characteristics of the Mo electrode film. For example, the raising of the sputtering power improves the crystalline characteristics of the Mo electrode film, but causes exfoliation of the Mo electrode film from the substrate due to stress generated in the sputtering step.

Moreover, the lower electrode film grown on the substrate in the conventional FBAR device cannot have excellent electrode characteristics.

FIGS. 2a and 2b are photographs, each illustrating the surface state and the sectional structure of the Mo lower electrode film of the conventional FBAR device, taken by means of a SEM (Scanning Electron Microscope).

With reference to FIGS. 2a and 2b, the surface state and the sectional structure of the Mo lower electrode film formed on a silicon nitride layer of the substrate structure are shown. The surface of the Mo lower electrode film is somewhat rough (Ra>10Å), and the sectional structure of the Mo lower electrode film is not so dense. This structure of the Mo lower electrode film depreciates the resonance characteristics of the FBAR device, and causes problems such as comparatively large resistivity and poor intensity. Since these problems vary sensitively according to the depositing conditions of the Mo lower electrode film, particularly according to the variation of the partial pressure of argon gas, it is difficult to control process conditions.

Accordingly, there has been required a technique for forming a Mo lower electrode with excellent crystalline characteristics so that the resonance characteristics of the piezoelectric layer and the electrode film characteristics of the Mo lower electrode film are improved regardless of the Mo depositing conditions by sputtering.

SUMMARY OF THE INVENTION

Therefore, the present invention has been made in view of the above problems, and it is an object of the present invention to provide a FBAR device comprising a seed layer made of Au or Ti between a substrate structure and a lower electrode film so as to improve the crystalline characteristics and the electrode characteristics of the lower electrode film.

It is another object of the present invention to provide a method for producing a FBAR device, in which a seed layer made of Au or Ti is formed on a substrate structure before a lower electrode film is formed thereon so as to improve the crystalline characteristics and the electrode characteristics of the lower electrode film.

In accordance with one aspect of the present invention, the above and other objects can be accomplished by the provision of a FBAR device comprising: a substrate structure provided with an upper surface; a seed layer formed on the upper surface of the substrate structure and made of one selected from gold (Au) and titanium (Ti); and one or more acoustic resonant portions, each including a lower electrode film formed on the seed layer and made of molybdenum (Mo), a piezoelectric layer formed on the lower electrode film and made of aluminum nitride (AlN), and an upper electrode film formed on the piezoelectric layer.

Preferably, the FBAR device may further comprise a layer made of tantalum (Ta) and formed between the seed layer and the substrate structure, in case that the seed layer is made of Au. Further, the upper electrode film may be made of Mo.

The present invention may be applied to various structures of the FBAR device.

In a further embodiment, the substrate structure may be a substrate provided with air gaps formed on its upper surface. Here, the acoustic resonant portions are plural in number and the air gaps are formed on the substrate at positions corresponding to each of the acoustic resonant portions.

In another embodiment, the substrate structure may include a substrate provided with a flat upper surface, and a membrane layer provided with an air gap formed on the upper surface of the substrate.

In another embodiment, the substrate structure may include a substrate provided with a flat upper surface, a membrane support layer formed on the upper surface of the substrate so that an air gap is surrounded by the membrane support layer, and a membrane layer formed on the upper surface of the membrane support layer so that the air gap is covered by the membrane layer.

Preferably, the membrane layer may be made of a silicon nitride or a silicon oxide. Here, the seed layer made of Au or Ti is formed on the membrane layer.

In accordance with another aspect of the present invention, there is provided a method for producing a FBAR device comprising the steps of: (a) preparing a substrate structure provided with an upper surface; (b) forming a seed layer made of one selected from gold (Au) and titanium (Ti) on the upper surface of the substrate structure; and (c) forming one or more acoustic resonant portions by sequentially stacking a lower electrode film formed on the seed layer and made of molybdenum (Mo), a piezoelectric layer formed on the lower electrode film and made of aluminum nitride (AlN), and an upper electrode film formed on the piezoelectric layer.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figure 3:
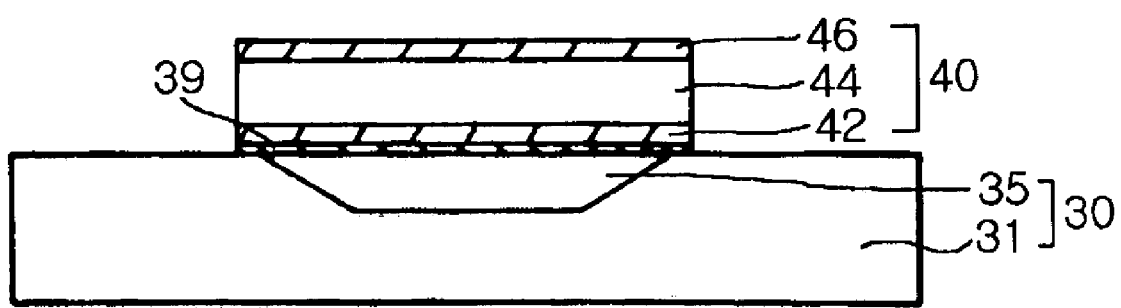
FIG. 3 is a cross-sectional view of a FBAR device in accordance with one embodiment of the present invention.

FIG. 3 is a cross-sectional view of a FBAR device in accordance with one embodiment of the present invention.

With reference to FIG. 3, the FBAR device comprises a substrate structure 30, and an acoustic resonant portion 40 including a lower electrode film 42, a piezoelectric layer 44 and an upper electrode film 46 formed on the substrate structure 30 in sequence. The substrate structure 30 includes a silicon substrate 31, and an air gap 35 formed on the upper surface of the silicon substrate 31 so that the air gap 35 corresponds to the acoustic resonant portion 40. The lower and upper electrode films 42 and 46 are made of molybdenum (Mo), and the piezoelectric layer 44 is made of aluminum nitride (AlN).

The present invention provides a method for improving the crystalline characteristics of the lower electrode film 42 made of Mo. Before the Mo lower electrode film 42 is deposited, a seed layer 39 made of Au or Ti is formed on the silicon substrate 31, thus allowing the Mo lower electrode film 42 grown in the seed layer 39 to have a preference for (110) orientation. When the lower electrode film 42 has the preference for (110) orientation, the piezoelectric layer 44 formed on the lower electrode film 42 can have a preference for (002) orientation. Accordingly, it is possible to improve the piezoelectric characteristics of the piezoelectric layer 44 and further to improve the resonance characteristics of the FBAR device. The lower electrode film 42 formed on the seed layer 39 is higher in density and smoother at its surface than the conventional lower electrode film, thus having improved electrical and mechanical electrode film characteristics. The thickness of the seed layer 39 employed by the present invention may be formed in the range several tens of Å~several thousands of Å.

In case that the seed layer 39 is made of Au, in order to prevent the seed layer 39 from being diffused into the silicon substrate 31, it is preferable to form a tantalum (Ta) layer (not shown) on the silicon substrate 31 before the seed layer 39 is deposited thereon.

In a method for producing the FBAR device shown in FIG. 3, the seed layer 39 is formed after the substrate structure is prepared and before the lower electrode film 42 is formed. That is, after a cavity is formed in the upper surface of the silicon substrate at a position of the acoustic resonant portion 20 and then filled with a sacrificial layer so that the upper surface of the substrate 31 is flat, the seed layer 39 is formed. Here, before the sacrificial layer formed, an oxide layer (not shown) is formed on the upper surface of the substrate 31 provided with the cavity so that the material of the sacrificial layer cannot be diffused into the substrate 31.

After the seed layer 39 made of Au or Ti is formed on the upper surface of the substrate 31, the Mo lower electrode film 42, the AlN piezoelectric layer 44 and the upper electrode film 46 are sequentially deposited to form the acoustic resonant portion 40. Finally, via holes are formed through the substrate 31 so that the sacrificial layer is removed by wet-etching using the via holes so as to form the air gap 35. Thereby, the FBAR device in accordance with this embodiment of the present invention is produced.

In the present invention, the lower electrode film 42 with the preference for (110) orientation is grown by forming the seed layer 39 made of Au or Ti before the deposition of the lower electrode film 42 made of Mo. As a result, the FBAR device of the present invention improves the piezoelectric characteristics of the piezoelectric layer 44 formed on the lower electrode film 42 as well as the electrode film characteristics of the lower electrode film 42.

Figure 4:
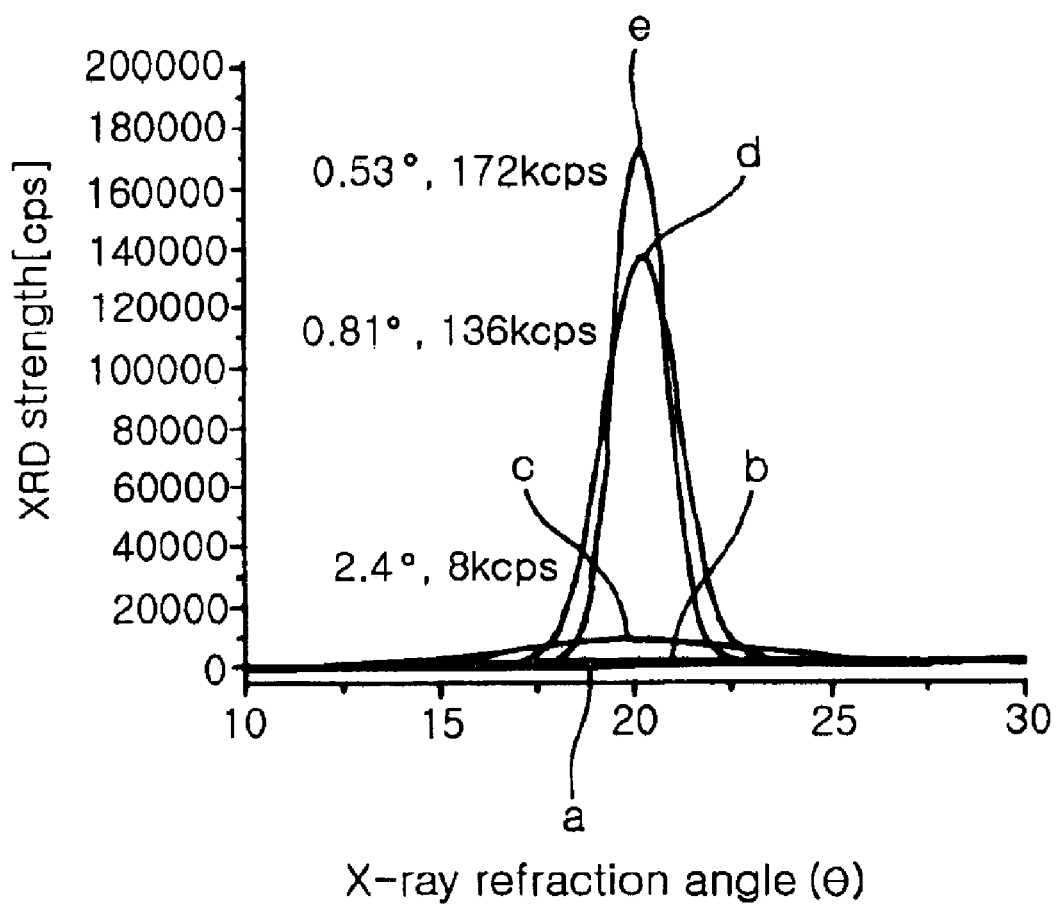
FIG. 4 is a graph comparatively illustrating crystalline characteristics of a Mo electrode lower film of the conventional FBAR device and a Mo electrode lower film of the FBAR device of the present invention.

FIG. 4 is a graph, which represents the improved crystalline characteristics of the Mo lower electrode film using the seed layer made of Au or Ti employed by the present invention.

In order to obtain the improved crystalline characteristics, five Mo lower electrode films with different structures are formed under the same depositing conditions using an Emerald sputter, in which sputtering power is 3 kw, the partial pressure of used argon is $2 \times 10^{-2}$ torr, and the temperature of the substrate is 250° C. That is, in the first comparative example (a), the Mo lower electrode film is deposited directly on the silicon substrate in accordance with the conventional manner. In the second and third comparative examples (b and c), the seed layers individually made of Ta and Cr, which are conventional materials, are formed on the silicon substrate, and then each of Mo lower electrode films is deposited thereon.

Further, in first and second test examples (d and e) of the present invention, the seed layer individually made of Ti and Au are formed on the silicon substrate, and then each of Mo lower electrode films is deposited thereon. In the second test example, a Ta layer is first formed on the substrate in order to prevent the Au material from being diffused into the substrate.

The crystalline characteristics of the Mo lower electrode films obtained by each comparative and test examples were analyzed using an XRD (X-ray diffraction) technique. Each XRD σ values of the resulting Mo lower electrode films were calculated by the equation (σ=FWHM (Full Width at Half Maximum)×0.425). The above-calculated XRD σ values correspond to refraction angles (θ=20°), and denote preferences to (110) orientation of Mo. The results of the XRD analysis and the obtained XRD σ values are shown by the graphs in FIG. 4.

With reference to the graphs in FIG. 4, the Mo lower electrode films obtained by the first and second comparative examples (a and b) do not have preferences to (110) orientation. Since the XRD σ value in the third example (c) is very high, i.e., 2.4°, the Mo lower electrode film obtained by the third comparative example (c) has a poor preference for (110) orientation.

On the other hand, since the XRD σ values in the first and second test examples of the present invention are very low, i.e., 0.81° and 0.53°, the Mo lower electrode films obtained by the first and second test examples have excellent preferences to (110) orientation.

As described above, in case that the seed layer is not formed or the seed layer made of Cr or Ta is formed, the Mo lower electrode film deposited on the seed layer does not have the preference or has poor preference for (110) orientation. On the other hand, in case that the seed layer made of Au or Ti in accordance with the present invention is formed, the Mo lower electrode film deposited on the seed layer has excellent preference for (110) orientation.

Figure 5:
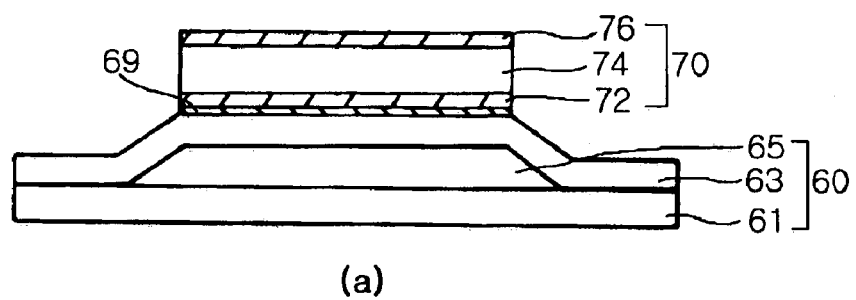
FIGS. 5a to 5c are cross-sectional views of FBAR devices in accordance with other embodiments of the present invention.
Figure 5:
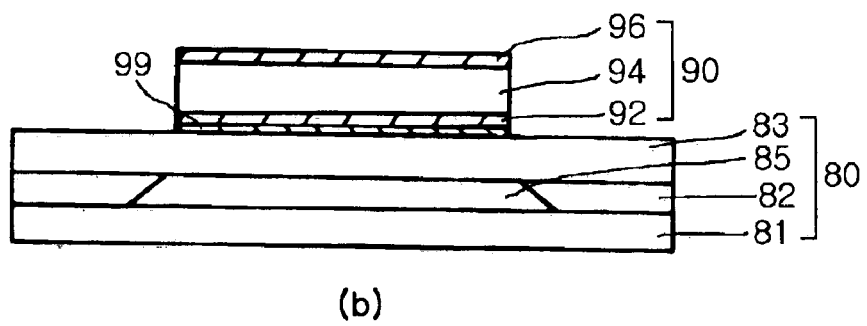
Figure 5:
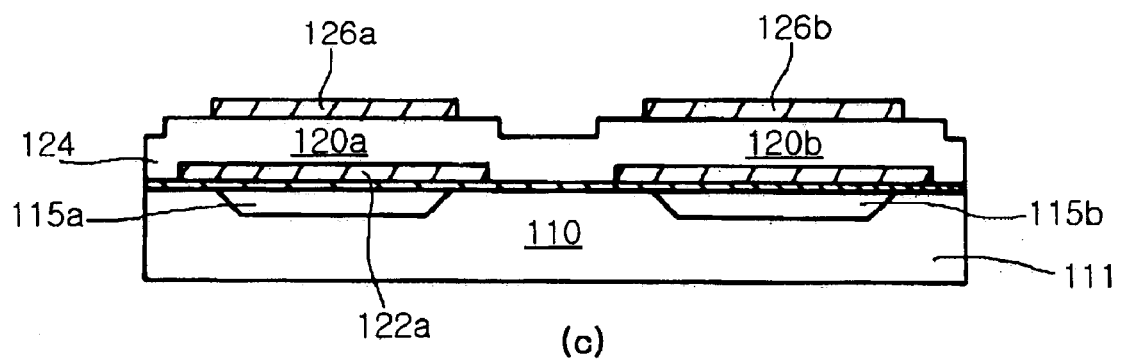

The present invention may be advantageously applied to other structures of the FBAR device. FIGS. 5a to 5c are cross-sectional views of FBAR devices in accordance with other embodiments of the present invention.

With reference to FIG. 5a, the FBAR device comprises a substrate structure 60 provided with a seed layer 69 formed on the upper surface, and an acoustic resonant portion 70 including a lower electrode film 72, a piezoelectric layer 74 and an upper electrode film 76 formed on the seed layer 69 in sequence. The substrate structure 60 includes a silicon substrate 61, and a membrane layer 63 provided with an air gap 65 and formed on the silicon substrate 61. The lower and upper electrode films 72 and 76 are made of molybdenum (Mo), and the piezoelectric layer 74 is made of aluminum nitride (AlN).

In this embodiment, the same as the previous embodiment shown in FIG. 3, before the Mo lower electrode film 72 is deposited, the seed layer 69 made of Au or Ti is formed on the membrane layer 63, thus allowing the Mo lower electrode film 72 grown on the seed layer 69 to have the preference for (110) orientation.

In a method for producing the FBAR device shown in FIG. 5a, the substrate structure 60 is formed by a step for forming a sacrificial layer (not shown) on the upper surface of the silicon substrate 61 at an area corresponding to the acoustic resonant portion 70 and a step for forming the membrane layer 63 so that the sacrificial layer is included by the membrane layer 63. The seed layer 69 made of Au or Ti is formed on the upper surface of the membrane layer 63, and then the Mo lower electrode film 72, the AlN piezoelectric layer 74, and the upper electrode film 76 are sequentially deposited thereon so as to form the acoustic resonant portion 70. Finally, the sacrificial layer is removed by wet-etching using via holes so as to form the air gap 65. Thereby, the FBAR device shown in FIG. 5a is produced.

FIG. 5b is a cross-sectional view a FBAR device in accordance with another embodiment of the present invention.

With reference to FIG. 5b, the FBAR device comprises a substrate structure 80 provided with a seed layer 89 formed on the upper surface, and an acoustic resonant portion 90 including a lower electrode film 92, a piezoelectric layer 94 and an upper electrode film 96 formed on the seed layer 89 in sequence. The substrate structure 80 includes a silicon substrate 81, and a membrane support layer 82 formed on the silicon substrate 81 so that an air gap 85 is surrounded by the membrane support layer 82, and a membrane layer 83 formed on the membrane support layer 82 so that the air gap 85 is covered with the membrane layer 83. The lower and upper electrode films 92 and 96 are made of molybdenum (Mo), and the piezoelectric layer 94 is made of aluminum nitride (AlN).

As described above, this embodiment uses the substrate structure with a different-type air gap in order to prevent the influence of acoustic waves on the substrate. In this embodiment, before the Mo lower electrode film 92 is deposited, the seed layer 89 made of Au or Ti is formed on the membrane layer 83, thus allowing the Mo lower electrode film 82 grown on the seed layer 89 to have the preference for (110) orientation.

In a method for producing the FBAR device shown in FIG. 5b, the substrate structure 80 is formed by a step for forming a sacrificial layer (not shown) on the upper surface of the silicon substrate 81 at an area corresponding to the acoustic resonant portion 90, a step for forming the membrane support layer 82 on the silicon substrate 81 so that the air gap 85 is surrounded by the membrane support layer 82, and a step for forming the membrane layer 83 on the membrane support layer 82 and the sacrificial layer. The seed layer 89 made of Au or Ti is formed on the upper surface of the membrane layer 83, and then the Mo lower electrode film 92, the AlN piezoelectric layer 94, and the upper electrode film 96 are sequentially deposited thereon so as to form the acoustic resonant portion 90. Finally, the sacrificial layer is removed by wet-etching using via holes so as to form the air gap 85. Thereby, the FBAR device shown in FIG. 5b is produced.

Further, the present invention may be applied to another FBAR device shown in FIG. 5c. FIG. 5c is a cross-sectional view of a FBAR device comprising two acoustic resonant portions formed on a single substrate structure.

With reference to FIG. 5c, the FBAR device comprises a substrate structure 110 provided with a seed layer 119 formed on the upper surface, and two acoustic resonant portions 120a and 120b formed on the seed layer 119. Each of two acoustic resonant portions 120a and 120b includes a lower electrode film 122a or 122b, a piezoelectric layer 124, and an upper electrode film 126a or 126b. The two acoustic resonant portions 120a and 120b include the same piezoelectric layer 124. The substrate structure 110 includes a silicon substrate 11, and two air gaps 125a and 125b corresponding to each of the two acoustic resonant portions 120a and 120b. The air gaps 125a and 125b have the same structure so that of the air gap 35 shown in FIG. 3, and are formed by the same method as that of the air gap 35.

As described above, the present invention is applied to various structures of the FBAR device. Therefore, the present invention provides the FBAR device in which the crystalline characteristics of the Mo lower electrode film are improved, thus allowing the FBAR device to have excellent piezoelectric characteristics of the piezoelectric layer and excellent electrode film characteristics of the Mo lower electrode film. In the FBAR devices shown in FIGS. 5a and 5b, the seed layer is not formed on the substrate but formed on the membrane layer. Generally, the membrane layer is made of a silicon oxide or a silicon nitride ($Si_xN_{1-x}$). The seed layer made of Au or Ti, employed by the present invention, has a desired effect even if the seed layer is formed on the membrane layer.

The seed layer in accordance with the present invention is little affected by the depositing conditions. Particularly, the Mo lower electrode film with excellent crystalline characteristics is grown on the seed layer regardless of the variation of the partial pressure of argon required to control internal stress in the deposition of the Mo lower electrode film.

In order to confirm the above fact, in the present invention, the membrane layer made of a silicon nitride ($Si_xN_{1-x}$) is formed on the silicon substrate, and the seed layer made of Ti is formed on the membrane layer. Then, after the Mo lower electrode film is deposited on the seed layer, the crystalline characteristics of the lower electrode film are observed.

In this test, four Mo lower electrode films with different partial pressures of argon, i.e., $2\times10^{-3}$, $5\times10^{-3}$, $5\times10^{-2}$, and $2\times10^{-2}$ torr in accordance with four test examples (a, b, c, and d) are formed using an Emerald sputter under the same depositing conditions in which the sputtering power is 3 kw, the partial pressure of argon is $2\times10^{-2}$ torr, and the temperature of the substrate is 250°.

Figure 6:
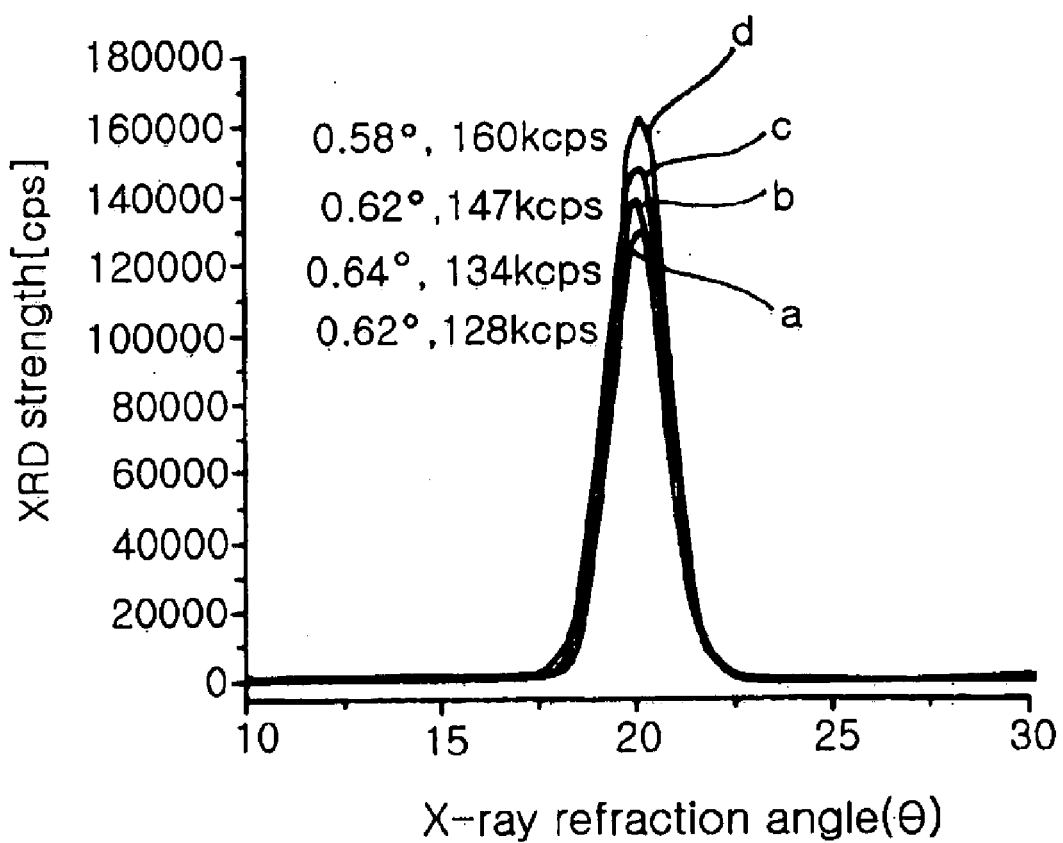
FIG. 6 is a graph illustrating crystalline characteristics of a Mo electrode lower film formed on a Ti seed layer in accordance with the present invention.

Crystalline characteristics of the resulting four Mo lower electrode films were analyzed using an XRD (X-ray diffraction) technique, and the analyzed results are shown in graphs of FIG. 6. XRD σ values of the resulting four Mo lower electrode films are very small, in the range of 0.58°~0.64°, and denote excellent preferences to (110) orientation. Further, the variation of XRD σ values according to the variation of the partial pressure of argon is only about 0.6°. Thus, it is appreciated that the variation of the XRD σ value is little influenced by the variation of the partial pressure of argon.

In order to more specifically analyze the effects of the variation of the argon partial pressure in the deposition of the Mo lower electrode film and the material of the seed layer on the crystallization of the Mo lower electrode film, another test is additionally carried out, as follows.

First, in the first and second test examples (a and b), the seed layer made of Ti is formed on the silicon substrate and the silicon nitride layer, and then the Mo lower electrode film is formed on the seed layer. In the first and second comparative test examples (c and d), the Mo lower electrode film is formed directly on the silicon substrate and silicon nitride layer without the formation of the seed layer. In each of the above test and comparative examples (a, b, c, and d), different partial pressures of argon in a sputtering step for forming the Mo lower electrode film, i.e., $2\times10^{-3}$, $5\times10^{-3}$, $5\times10^{-2}$, and $2\times10^{-2}$ torr, are applied, thus producing 4 samples from each examples, i.e., total 16 samples. Then, the obtained samples were analyzed using an XRD (X-ray diffraction) technique, and XRD σ values denoting the preference for (110) orientation of the samples were calculated. Using the calculated XRD σ values, graphs, which represent the relationship between the variation of the partial pressure of argon and the variation of the XRD σ value, are obtained in FIG. 7.

The Mo lower electrode films obtained by the first and second test examples have very small XRD σ values in the range of 0.53°~0.57° and in the range of 0.58°~0.64°, and very small variation of the XRD σ value according to the variation of the partial pressure of argon, i.e., 0.04° and 0.06°. On the other hand, the Mo lower electrode films obtained by the first and second comparative examples have large XRD σ values in the range of 1.59°~1.95° and in the range of 2.31~2.47°, and large variation of the XRD σ value according to the variation of the partial pressure of argon, i.e., 0.36° and 0.16°.

As the result of the above test, the conventional Mo lower electrode film has a poor preference for (110) orientation, and the orientation is very sensitive to the variation of the partial pressure of argon. On the other hand, the Mo lower electrode film formed on the Ti seed layer in accordance with the present invention has an excellent preference for (110) orientation, and the orientation is little influenced by the variation of the partial pressure of the argon. Accordingly, the FBAR device of the present invention has a comparatively wide allowable range of the partial pressure of argon applied in the sputtering step, in order to obtain proper internal stress of the Mo lower electrode film required to support the air gap.

Figure 7:
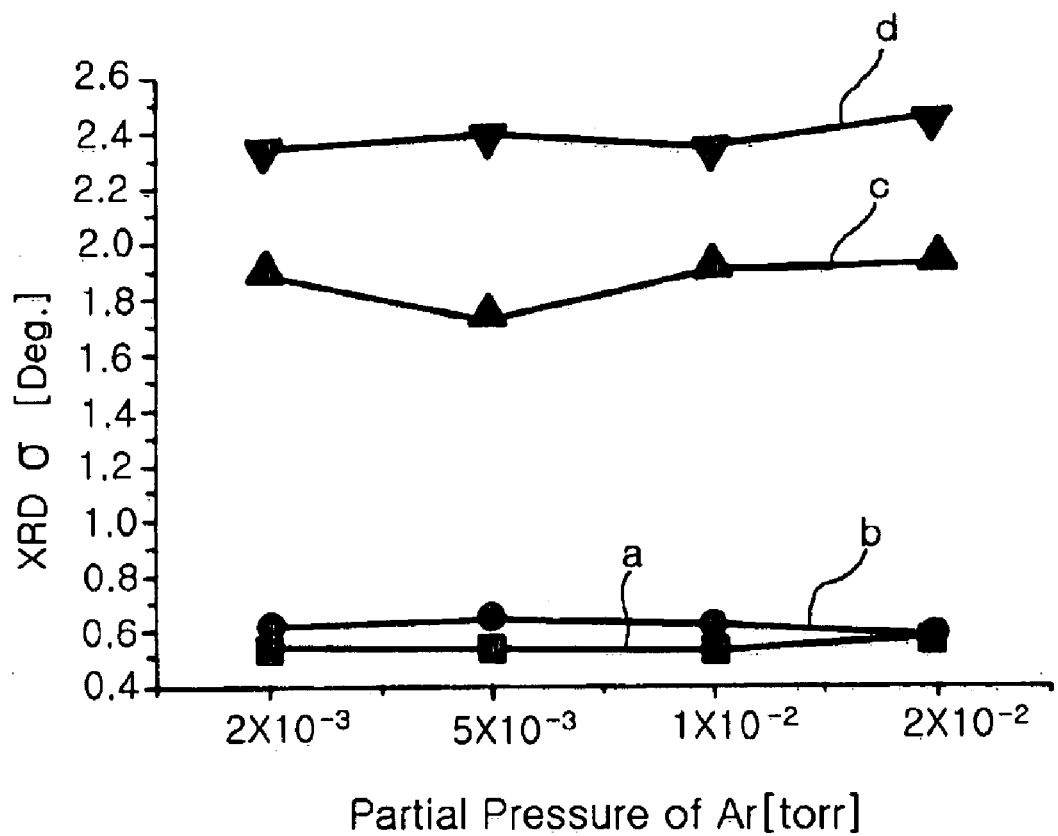
FIG. 7 is a graph comparatively illustrating crystalline characteristics of a Mo electrode lower film of the conventional FBAR device and a Mo electrode lower film of the FBAR device of the present invention according to partial pressure of argon (Ar) in a sputtering step.

As shown in FIG. 7, compared to the Mo lower electrode films of the comparative examples, the Mo lower electrode films of the test examples of the present invention have small variation of the preference for (110) orientation according to kinds of the material of the substrate (a silicon substrate or a silicon nitride substrate).

The Mo lower electrode film of the FBAR device of the present invention has a very small grain size, a smooth surface state, and a high-density structure.

FIGS. 8a to 8d are photographs, taken by a SEM, of the Mo lower electrode films of the FBAR device of the present invention.

Figure 8:
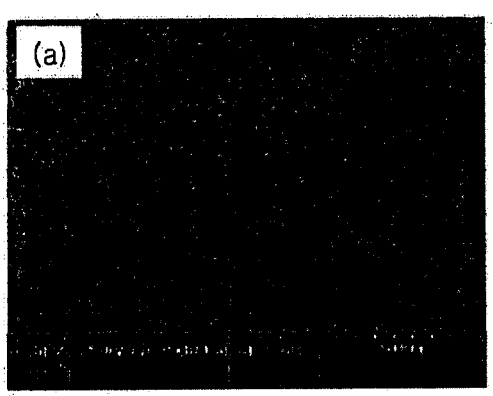
FIGS. 8a to 8d are photographs, each illustrating the surface state and the sectional structure of a Mo lower electrode film of the FBAR device of the present invention, taken by means of a SEM.
Figure 8:
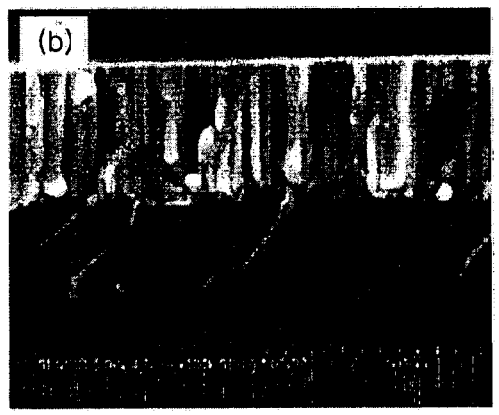
Figure 8:
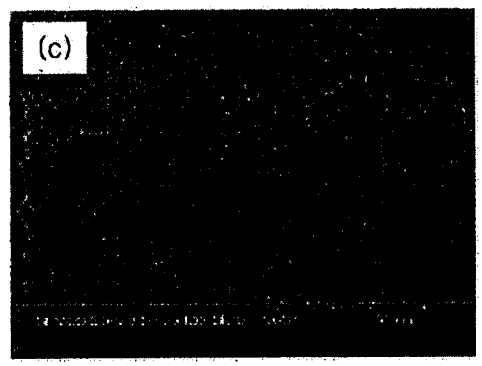
Figure 8:

Here, FIGS. 8a and 8b individually show the surface state and the sectional structure of the Mo lower electrode film formed on the Ti seed layer. FIGS. 8c and 8d individually show the surface state and the sectional structure of the Mo lower electrode film formed on the Au seed layer (including the Ta layer formed between the substrate and the seed layer).

Figure 1:
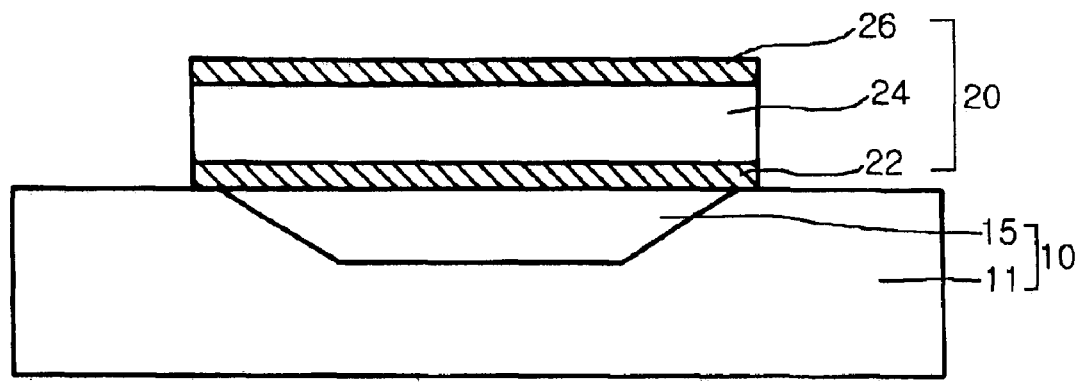
FIG. 1 is a cross-sectional view of a conventional FBAR (Film Bulk Acoustic Resonator) device.
Figure 2:
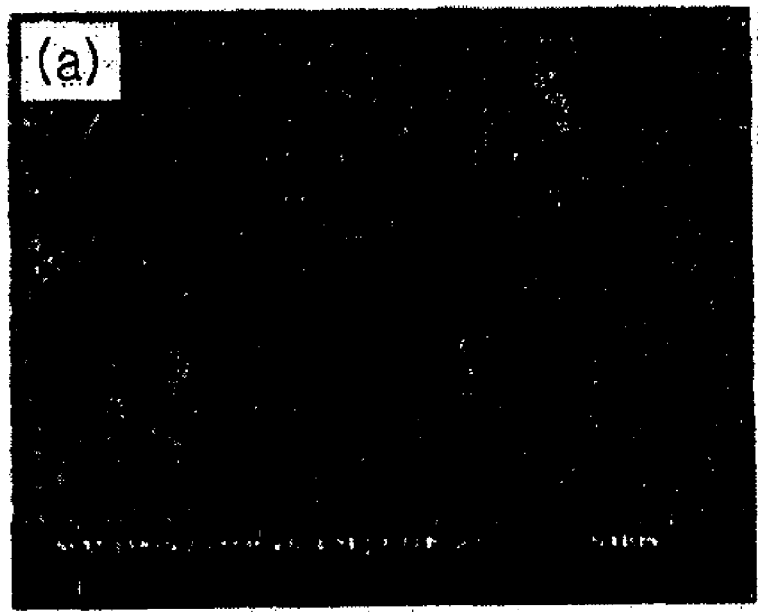
FIGS. 2a and 2b are photographs, each illustrating the surface state and the sectional structure of a Mo lower electrode film of the conventional FBAR device, taken by means of a SEM (Scanning Electron Microscope)
Figure 2:
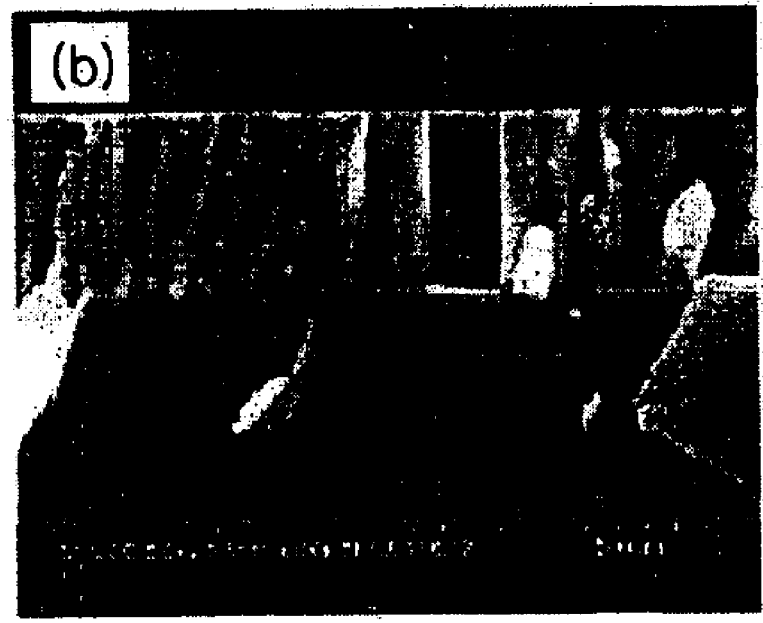

With reference to FIGS. 8a and 8c, the Mo lower electrode film formed on the Ti or Au seed layer has a smoother surface than that of the Mo lower electrode film of the conventional FBAR device of FIG. 2a. The Mo lower electrode film of the present invention has surface roughness (Ra) less than 10Å, thus reducing bad effects of the surface roughness of the film on the resonance characteristics of the FBAR device.

Further, as shown in FIGS. 8b and 8d, the Mo lower electrode film formed on the Ti or Au seed layer has a higher-density sectional structure than that of the Mo lower electrode film of the conventional FBAR device of FIG. 2a.

The substrate structure of the FBAR device of the present invention is a substrate provided with a structure for reducing the effect of the substrate on acoustic waves, such as the air gap. It will be appreciated to the persons skilled in the art that a substrate structure using Bragg reflection may be employed by the FBAR device of the present invention instead of the above-described substrate structure provided with the air gap. That is, the substrate structure has a structure of a reflective layer in which two or more layers with different impedances are alternately stacked.

As apparent from the above description, the present invention provides a FBAR device, in which a Mo lower electrode film is formed on a seed layer made of Au or Ti, thus improving the electrode film characteristics (resistivity) and having the smooth surface state and high-density structure. Further, the FBAR device of the present invention has an excellent preference for (110) orientation, thus allowing an AlN piezoelectric layer formed on the lower electrode film to have (002) orientation with excellent piezoelectric characteristics. Accordingly, it is possible to improve the resonance characteristics of the FBAR device. Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claim is:

1. A film bulk acoustic resonator (FBAR) device, comprising:
   a substrate structure having an upper surface;
   a seed layer formed on the upper surface of the substrate structure and consisting essentially of one metal selected from the group consisting of gold (Au) and titanium (Ti); and
   one or more acoustic resonant portions, each including a lower electrode film formed on the seed layer and made of molybdenum (Mo), a piezoelectric layer formed on the lower electrode film and made of aluminum nitride (AlN), and an upper electrode film formed on the piezoelectric layer.

2. The FBAR device as set forth in claim 1, further comprising a layer made of tantalum (Ta) and formed between the seed layer and the substrate structure, wherein the seed layer is made of Au.

3. The FBAR device as set forth in claim 1, wherein the upper electrode film is made of Mo.

4. The FBAR device as set forth in claim 1, wherein the substrate structure is a substrate having air gaps formed on an upper surface thereof.

5. The FBAR device as set forth in claim 4, comprising multiple said acoustic resonant portion, wherein the air gaps are formed at positions corresponding to the acoustic resonant portions.

6. The FBAR device as set forth in claim 1, wherein the substrate structure includes
   a substrate having a flat upper surface, and
   a membrane layer formed on the upper surface of the substrate to define an air gap therebetween.

7. The FBAR device as set forth in claim 1, wherein the substrate structure includes
   a substrate having a flat upper surface,
   a membrane support layer formed on the upper surface of the substrate, and
   a membrane layer formed on an upper surface of the membrane support layer so as to define an air gap between the membrane layer and the substrate, wherein said air gap is covered by the membrane layer and surrounded by the membrane support layer.

8. The FBAR device as set forth in claim 6, wherein the membrane layer is made of a silicon nitride or a silicon oxide.

9. The FBAR device as set forth in claim 7, wherein the membrane layer is made of a silicon nitride or a silicon oxide.

10. The FBAR device as set forth in claim 1, wherein the substrate structure is a reflective layer in which two or more layers with different impedances are alternately stacked.

11. A film bulk acoustic resonator (FBAR) device, comprising:
    a substrate structure having an upper surface;
    a seed layer formed on the upper surface of the substrate structure and made of one selected from gold (Au) and titanium (Ti); and
    one or more acoustic resonant portions, each including a lower electrode film formed on the seed layer and made of molybdenum (Mo), a piezoelectric layer formed on the lower electrode film and made of aluminum nitride (AlN), and an upper electrode film formed on the piezoelectric layer;
    wherein the substrate structure is a reflective layer in which two or more layers with different impedances are alternately stacked.

12. A method of producing a film bulk acoustic resonator (FBAR) device, said method comprising the steps of:
    (a) preparing a substrate structure having an upper surface;
    (b) forming a seed layer consisting essentially of one metal selected from the group consisting of gold (Au) and titanium (Ti) on the upper surface of the substrate structure; and
    (c) forming one or more acoustic resonant portions by sequentially stacking a lower electrode film made of molybdenum (Mo) on the seed layer, a piezoelectric layer made of aluminum nitride (AlN) on the lower electrode film, and an upper electrode film on the piezoelectric layer.

13. The method as set forth in claim 12, further comprising the step of
    (b') forming a layer made of tantalum (Ta) on the substrate structure before the step (b), wherein the seed layer is made of Au.

14. The method as set forth in claim 12, wherein the upper electrode film is made of Mo.

15. The method as set forth in claim 12, wherein:

the step (a) includes:

(a-1) preparing a substrate;

(a-2) forming a cavity on an upper surface of the substrate; and (a-3) forming a sacrificial layer in the cavity so that the upper surface of the substrate is flat; and the method further comprises, after the step (c), the step of (d) removing the sacrificial layer so as to form an air gap.

16. The method as set forth in claim 15, wherein:

a plurality of cavities are formed in the step (a-2); and a plurality of acoustic resonant portions are formed, in the step (c), on the upper surface of the substrate in positions corresponding to the sacrificial layer formed in said cavities.

17. The method as set forth in claim 12, wherein:

the step (a) includes:

(a-1) providing a substrate with a flat upper surface;

(a-2) forming a sacrificial layer on the upper surface of the substrate at positions corresponding to where the acoustic resonant portions are to be formed in the step (c); and (a-3) forming a membrane layer on the substrate so that the sacrificial layer is covered by the membrane layer; and the method further comprises, after the step (c), the step of (d) removing the sacrificial layer so as to form an air gap.

18. The method as set forth in claim 12, wherein:

the step (a) includes:

(a-1) providing a substrate with a flat upper surface;

(a-2) fanning a sacrificial layer on the upper surface of the substrate at positions corresponding to where the acoustic resonant portions are to be formed in the step (c);

(a-3) forming a membrane support layer on the upper surface of the substrate so that the sacrificial layer is surrounded by the membrane support layer; and (a-4) fanning a membrane layer on the membrane support layer and the sacrificial layer; and the method further comprises, after the step (c), the step of (d) removing the sacrificial layer so as to form an air gap.

19. The method as set forth in claim 17, wherein the membrane layer is made of a silicon nitride or a silicon oxide.

20. The method as set forth in claim 18, wherein the membrane layer is made of a silicon nitride or a silicon oxide.

* * * * *